United States Patent
Guan et al.

(10) Patent No.: US 10,916,662 B2
(45) Date of Patent: Feb. 9, 2021

(54) OXIDE THIN FILM TRANSISTOR, ARRAY SUBSTRATE, AND PREPARATION METHODS THEREOF

(71) Applicant: BOE Technology Group Co., Ltd., Beijing (CN)

(72) Inventors: Feng Guan, Beijing (CN); Guangcai Yuan, Beijing (CN); Zhi Wang, Beijing (CN); Chen Xu, Beijing (CN); Qi Yao, Beijing (CN); Zhanfeng Cao, Beijing (CN); Ce Ning, Beijing (CN); Woobong Lee, Beijing (CN); Lei Chen, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/528,622

(22) Filed: Aug. 1, 2019

(65) Prior Publication Data

US 2020/0185535 A1    Jun. 11, 2020

(30) Foreign Application Priority Data

Dec. 7, 2018    (CN) .......................... 2018 1 1494714

(51) Int. Cl.
  *H01L 29/786*    (2006.01)
  *H01L 27/12*    (2006.01)

(52) U.S. Cl.
  CPC .... *H01L 29/78693* (2013.01); *H01L 27/1225* (2013.01); *H01L 27/1285* (2013.01)

(58) Field of Classification Search
  CPC .......... H01L 29/7869; H01L 29/78693; H01L 29/78696; H01L 27/1225; H01L 27/1274; H01L 27/1285; H01L 29/66772
  See application file for complete search history.

(56) References Cited

U.S. PATENT DOCUMENTS

| 7,001,829 B1 | 2/2006 | Yamazaki |
| 8,343,800 B2 | 1/2013 | Umeda et al. |

(Continued)

FOREIGN PATENT DOCUMENTS

| CN | 101931009 A | 12/2010 |
| CN | 104037060 A | 9/2014 |

(Continued)

OTHER PUBLICATIONS

First Office Action, including Search Report, for Chinese Patent Application No. 201811494714.7, dated Jul. 3, 2020, 17 pages.

*Primary Examiner* — Zandra V Smith
*Assistant Examiner* — Molly K Reida
(74) *Attorney, Agent, or Firm* — Westman, Champlin & Koehler, P.A.

(57) ABSTRACT

An oxide thin film transistor, an array substrate, and preparation methods thereof are disclosed. The method for preparing an oxide thin film transistor comprises a step of forming a pattern comprising an oxide semiconductor active layer on a substrate, wherein the step comprises: forming an amorphous oxide semiconductor thin film on the substrate; performing an excimer laser annealing, at least at a position in the amorphous oxide semiconductor thin film corresponding to a channel region of oxide semiconductor active layer to be formed, such that the amorphous oxide semiconductor material at the laser-annealed position is crystallized, to form a crystalline oxide semiconductor material; and forming the pattern comprising the oxide semiconductor active layer.

18 Claims, 4 Drawing Sheets

(56) References Cited

U.S. PATENT DOCUMENTS

| | | |
|---|---|---|
| 9,378,953 B2 | 6/2016 | Li et al. |
| 2008/0258140 A1 | 10/2008 | Lee et al. |
| 2009/0152554 A1* | 6/2009 | Cho ............... H01L 27/1288 |
| | | 257/59 |
| 2010/0320459 A1 | 12/2010 | Umeda et al. |
| 2015/0329432 A1 | 11/2015 | Li et al. |
| 2018/0061990 A1* | 3/2018 | Yan ................ H01L 29/7869 |
| 2018/0204898 A1* | 7/2018 | Li ................. H01L 29/78651 |

FOREIGN PATENT DOCUMENTS

| | | | | |
|---|---|---|---|---|
| CN | 105655389 A | * | 6/2016 | ......... H01L 29/4908 |
| CN | 106816473 A | * | 6/2017 | ......... H01L 29/7869 |

\* cited by examiner

OXIDE THIN FILM TRANSISTOR, ARRAY SUBSTRATE, AND PREPARATION METHODS THEREOF

CROSS REFERENCE TO RELATED APPLICATION

This application claims the benefit of priority to Chinese Patent Application No. 201811494714.7, filed on Dec. 7, 2018, the disclosure of which is incorporated herein by reference in its entirety.

TECHNICAL FIELD

The present disclosure relates to the technical field of display, and particularly to an oxide thin film transistor, an array substrate, and preparation methods thereof.

BACKGROUND

Oxide semiconductor materials have relatively high mobility, and can be used in a large size OLED and a high resolution (PPI) display device thereof, to meet the requirements of back panel properties for a display device. By taking indium gallium zinc oxide (IGZO) semiconductor material as an example, IGZO prepared by a process such as magnetron sputtering is usually amorphous and has a poor stability, limiting the large scale application of this semiconductor material. Therefore, how to improve the stability of a display device becomes a hot spot of investigation.

SUMMARY

The embodiments of the present disclosure provide a method for preparing an oxide thin film transistor, comprising a step of forming a pattern comprising an oxide semiconductor active layer on a substrate, wherein the step of forming the pattern comprising the oxide semiconductor active layer comprises:

forming an amorphous oxide semiconductor thin film on the substrate;

performing an excimer laser annealing, at least at a position in the amorphous oxide semiconductor thin film corresponding to a channel region of oxide semiconductor active layer to be formed, such that the amorphous oxide semiconductor material at the laser-annealed position in the amorphous oxide semiconductor thin film is crystallized, to form a crystalline oxide semiconductor material; and forming the pattern comprising the oxide semiconductor active layer.

In some embodiments, the step of forming the pattern comprising the oxide semiconductor active layer comprises:

forming the pattern comprising the oxide semiconductor active layer, only by an etching process.

In some embodiments, the laser has a wavelength in a range from 150 nm to 350 nm.

In some embodiments, the laser comprises a KrF laser with a wavelength of 248 nm.

In some embodiments, a micro-lens array (MLA) device is used in the excimer laser annealing.

In some embodiments, a material for the amorphous oxide semiconductor thin film is any one selected from an oxygen-containing compound, a sulfur-containing compound, a nitrogen and oxygen-containing compound, or a sulfur and oxygen-containing compound, each of the compounds comprising at least one element selected from indium, gallium, zinc, aluminum, or tin.

In some embodiments, the formed oxide semiconductor active layer has a channel width of from $5 \times 10^{-3}$ μm to 10 μm.

In some embodiments, the formed oxide semiconductor active layer has a channel width less than 3 μm.

In some embodiments, before the step of forming the pattern comprising the oxide semiconductor active layer, the method further comprises:

forming a pattern comprising a gate electrode of the oxide thin film transistor on the substrate by a patterning process, and forming a gate electrode insulating layer on a side of the gate electrode away from the substrate; and after the step of forming the pattern comprising the oxide semiconductor active layer, the method further comprises:

forming a pattern comprising a source electrode and a drain electrode of the oxide thin film transistor by a patterning process, wherein the source electrode and the drain electrode are connected to a source electrode contact region and a drain electrode contact region of the oxide semiconductor active layer respectively.

In some embodiments, after the step of forming the pattern comprising the oxide semiconductor active layer, the method further comprises:

forming a pattern comprising a source electrode and a drain electrode of the oxide thin film transistor by a patterning process, wherein the source electrode and the drain electrode are connected to a source electrode contact region and a drain electrode contact region of the oxide semiconductor active layer respectively;

forming a gate electrode insulating layer on a side of the source electrode and the drain electrode away from the substrate; and forming a pattern comprising a gate electrode of the oxide thin film transistor on a side of the gate electrode insulating layer away from the substrate by a patterning process.

The embodiments of the present disclosure further provide a method for preparing an array substrate, comprising a step of forming a pattern comprising an oxide semiconductor active layer on a substrate, wherein the step of forming the pattern comprising the oxide semiconductor active layer comprises:

forming an amorphous oxide semiconductor thin film on the substrate;

performing an excimer laser annealing, at least at a position in the amorphous oxide semiconductor thin film corresponding to a channel region of oxide semiconductor active layer to be formed, such that the amorphous oxide semiconductor material at the laser-annealed position in the amorphous oxide semiconductor thin film is crystallized, to form a crystalline oxide semiconductor material; and forming the pattern comprising the oxide semiconductor active layer.

The embodiments of the present disclosure further provide an oxide thin film transistor comprising:

a gate electrode;
a source electrode;
a drain electrode; and
an oxide semiconductor active layer comprising: a source electrode contact region and a drain electrode contact region connected to the source electrode and the drain electrode respectively, and a channel region between the source electrode contact region and the drain electrode contact region, wherein at least the channel region of the active layer is formed from a crystalline oxide semiconductor material, and the active layer has a channel width less than 3 μm.

In some embodiments, the source electrode contact region and the drain electrode contact region of the active layer are formed from an amorphous oxide semiconductor material.

In some embodiments, the channel region of the active layer has a bent and curved shape.

In some embodiments, the amorphous oxide semiconductor material is any one selected from an oxygen-containing compound, a sulfur-containing compound, a nitrogen and oxygen-containing compound, or a sulfur and oxygen-containing compound, each of the compounds comprising at least one element selected from indium, gallium, zinc, aluminum, or tin.

In some embodiments, the channel region of the active layer is formed by subjecting an amorphous oxide semiconductor thin film to a localized excimer laser annealing, wherein the amorphous oxide semiconductor material at the laser-annealed position in the amorphous oxide semiconductor thin film is crystallized to form the crystalline oxide semiconductor material.

In some embodiments, the oxide thin film transistor is a bottom gate type thin film transistor.

In some embodiments, the oxide thin film transistor is a top gate type thin film transistor.

The embodiments of the present disclosure further provide an array substrate comprising the above-mentioned oxide thin film transistor.

In some embodiments, the array substrate comprises a display area and a peripheral area provided with a driving circuit, wherein the above-mentioned oxide thin film transistor is used as a thin film transistor in the driving circuit.

DETAILED DESCRIPTION

In order for those skilled in the art to better understand the technical solutions of the present disclosure, the present disclosure will be further described in detail below with reference to the drawings and particular embodiments.

In the embodiments of the present disclosure, the patterning process may comprise only a photolithography process, or comprise a photolithography process and an etching step, as well as other processes for forming a predetermined pattern such as printing and ink jet. The photolithography process refers to a process for forming a pattern using a photoresist, a mask plate, an exposure machine and so on, comprising a film formation process, an exposure process, a development process and so on. The patterning process can be selected depending on the structures formed in the embodiments.

In the embodiments of the present disclosure, the oxide thin film transistor comprises: a gate electrode, a source electrode, a drain electrode and an active layer, wherein the active layer is divided into three portions, i.e., a source electrode contact region, a drain electrode contact region, and a channel region disposed between the source electrode contact region and the drain electrode contact region, wherein the source electrode contact region of the active layer is connected to the source electrode, and the drain electrode contact region of the active layer is connected to the drain electrode. Here, at least the channel region of the active layer is formed from a crystalline oxide semiconductor material, thereby at least partially solving the problem of poor stability existed in amorphous oxide semiconductor materials with a representative of IGZO, and thus the stability of the device can be effectively improved.

In the embodiments of the present disclosure, at least the channel region of the active layer (or the entire active layer) may be formed by converting an amorphous oxide semiconductor material to a crystalline oxide semiconductor material through a localized excimer laser annealing technology. In this way, the thinning of the active layer can be achieved and the channel width can be reduced, thereby effectively reducing the size of the formed thin film transistor.

The methods for preparing an oxide thin film transistor and for preparing an array substrate as well as the thin film transistor and array substrate prepared therefrom will be described below with reference to particular embodiments.

Embodiments of the present disclosure provide an oxide thin film transistor and a preparation method thereof, and particularly, an oxide semiconductor active layer and a preparation thereof.

Figure 1:
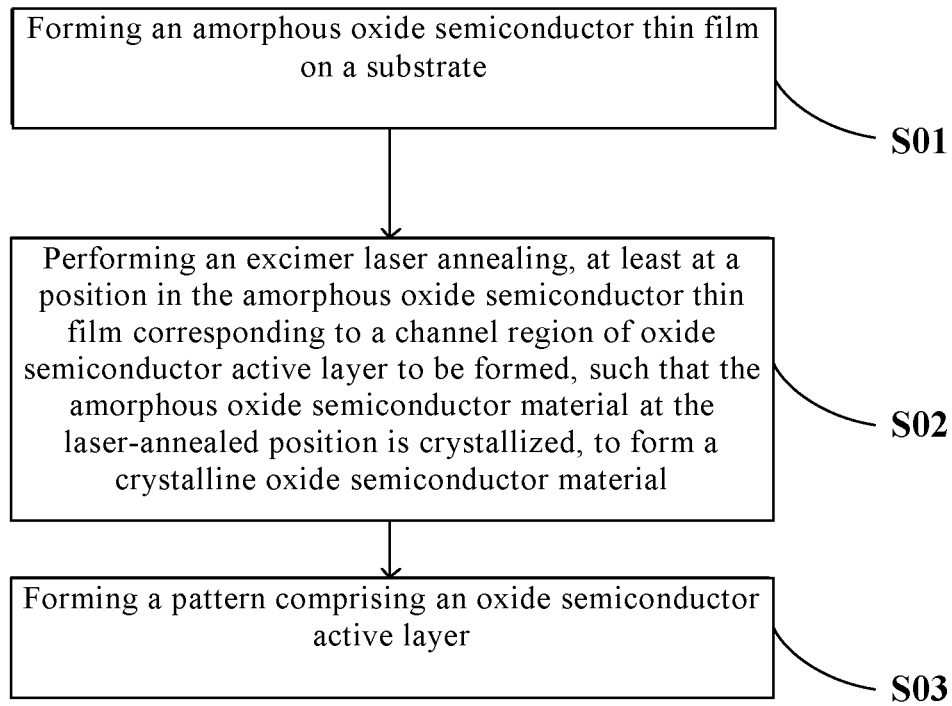
FIG. 1 is a flow chart of forming an oxide semiconductor active layer in a method for preparing an oxide thin film transistor according to an embodiment of the present disclosure.
Figure 2:
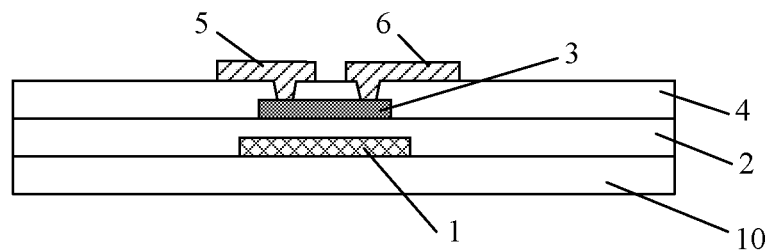
FIG. 2 is a schematic structural diagram of an oxide thin film transistor according to an embodiment of the present disclosure.

As shown in FIG. 1 and FIG. 2, in the preparation method of the embodiment, a step of forming a pattern comprising an oxide semiconductor active layer comprises:

S01: Forming an amorphous oxide semiconductor thin film on a substrate 10.

S02: Performing an excimer laser annealing, at least at a position in the amorphous oxide semiconductor thin film corresponding to a channel region of oxide semiconductor active layer to be formed, such that the amorphous oxide semiconductor material at the laser-annealed position in the amorphous oxide semiconductor thin film is crystallized, to form a crystalline oxide semiconductor material.

S03: Forming the pattern comprising the oxide semiconductor active layer 3.

With the preparation method of the embodiment, it allows at least the channel region of the active layer of the formed oxide thin film transistor to be a crystalline oxide semiconductor material, so that the stability of the device can be effectively improved. In particular, by irradiating the amorphous oxide semiconductor thin film with a laser having a specific wavelength (for example, a KrF laser having a wavelength of 248 nm), the channel width of the active layer of the formed crystalline semiconductor material can reach a nanoscale line width. Therefore, the size of the device can be effectively reduced, and in turn the aperture ratio of the display panel using the device can be increased, thereby achieving a high resolution display.

The above-mentioned method for preparing an oxide thin film transistor will be specifically described below with reference to the following embodiment.

Figure 3:
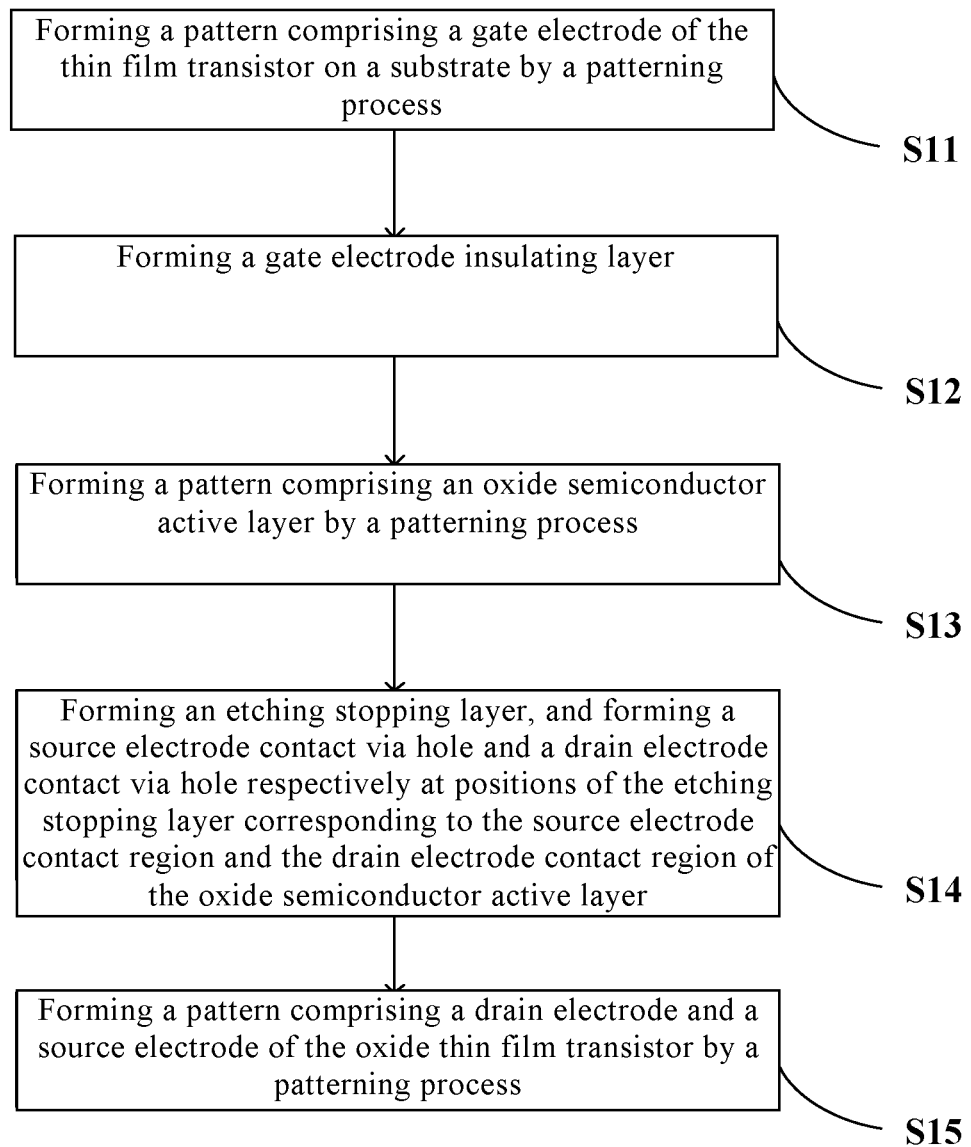
FIG. 3 is a flow chart of a method for preparing an oxide thin film transistor according to an embodiment of the present disclosure.
Figure 4:
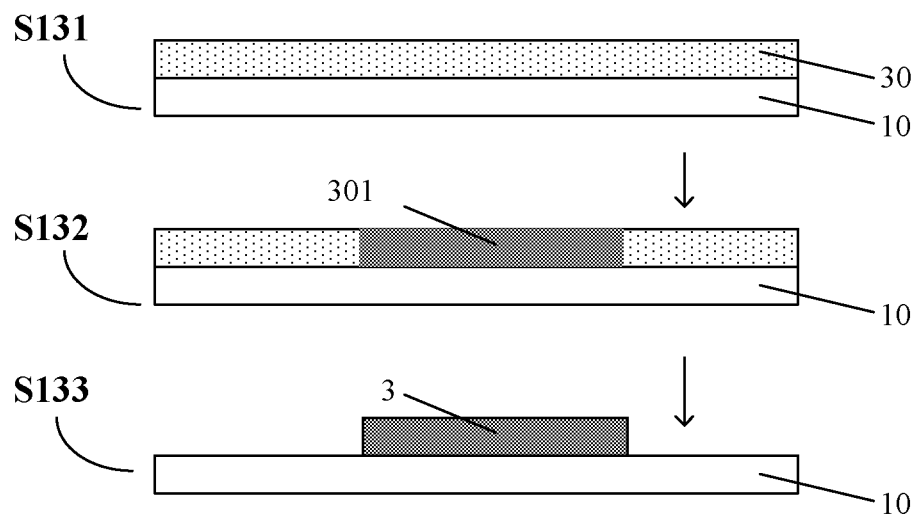
FIG. 4 is a particular flow chart of step S13 of a method for preparing an oxide thin film transistor according to an embodiment of the present disclosure.

As shown in FIGS. 2-4, the embodiment provides a method for preparing a thin film transistor. In particular, the method comprises the following steps.

S11: Forming a pattern comprising a gate electrode 1 of the thin film transistor on a substrate 10 by a patterning process.

In this step, the substrate 10 is made from a transparent material such as glass, and is pre-washed. In particular, the pattern comprising the gate electrode 1 of the thin film transistor is formed by depositing a gate metal film on the substrate 10 by plasma enhanced chemical vapor deposition (PECVD), low pressure chemical vapor deposition (LPCVD), atmospheric pressure chemical vapor deposition (APCVD) or electron cyclotron resonance chemical vapor deposition (ECR-CVD), and forming a photoresist layer on the gate metal film, followed by exposing through a mask plate, developing, and etching.

Here, one or more of molybdenum (Mo), molybdenum-niobium alloy (MoNb), aluminum (Al), aluminum-neodymium alloy (AlNd), titanium (Ti), or copper (Cu) may be used as a material for the gate metal film. The gate metal film may be a monolayer or multilayer composite laminate formed from one or more of the aforementioned materials, for example, a monolayer or multilayer composite film composed of Mo, Al or an alloy containing Mo or Al.

S12: Forming a gate electrode insulating layer 2 on the substrate 10 on which the above-mentioned step has been performed.

In this step, a gate electrode insulating layer is formed on the substrate 10, on which step S11 has been performed, by plasma enhanced chemical vapor deposition, low pressure chemical vapor deposition, atmospheric pressure chemical vapor deposition, electron cyclotron resonance chemical vapor deposition, or sputtering.

Here, a material for the gate electrode insulating layer 2 may be silicon oxide ($SiO_x$), silicon nitride ($SiN_x$), hafnium oxide ($HfO_x$), silicon oxynitride (SiON), aluminum oxide ($AlO_x$), or the like. Alternatively, the gate electrode insulating layer 2 may be a multilayer film composed of two or three of the aforementioned materials.

S13: Forming a pattern comprising an oxide semiconductor active layer 3 on the substrate 10, on which the above-mentioned step has been performed, by a patterning process.

As shown in FIG. 4, in particular, this step comprises:

S131: Forming an amorphous oxide semiconductor thin film 30 on the substrate 10, on which step S12 has been performed, by magnetron sputtering, thermal evaporation, plasma enhanced chemical vapor deposition, low pressure chemical vapor deposition, atmospheric pressure chemical vapor deposition, or electron cyclotron resonance chemical vapor deposition, and placing a mask plate on a side of the amorphous oxide semiconductor material away from the substrate 10.

Here, a material for the amorphous oxide semiconductor thin film 30 is any one of an oxygen-containing compound, a sulfur-containing compound, a nitrogen and oxygen-containing compound, or a sulfur and oxygen-containing compound, each of the compounds comprising at least one element selected from indium, gallium, zinc, aluminum, or tin.

S132: Performing a laser annealing at a position in the amorphous oxide semiconductor thin film corresponding to the oxide semiconductor active layer 3 to be formed, by irradiating with laser through the mask plate, such that the amorphous oxide semiconductor material, at the position in the amorphous oxide semiconductor thin film corresponding to the oxide semiconductor active layer 3 to be formed, is crystallized to form a crystalline oxide semiconductor material 301.

Specifically, in this step, a micro-lens array (MLA) device may be used, and a laser annealing, using a laser having a wavelength in a range from 150 nm to 350 nm, in particular, a KrF laser having a wavelength of 248 nm, is performed at the position in the amorphous oxide semiconductor thin film corresponding to the oxide semiconductor active layer 3 to be formed. As such, the active layer 3 subsequently formed by an etching process can be thinned, and thus the size of the formed thin film transistor can be effectively reduced, and in turn it is possible to increase the aperture ratio of the display panel using the thin film transistor, while achieving a high resolution display.

Here, the channel width of the oxide semiconductor active layer formed in this step is from $5 \times 10^{-3}$ μm to 10 μm, for example, less than 3 μm, less than 2 μm, or less than 1 μm. The channel width may be greater than 10 nm, for example, greater than or equal to 100 nm, or greater than or equal to 250 nm.

S133: etching the oxide semiconductor thin film directly with an etchant, by taking advantage of the property of the etchant that the etchant has a relatively large selection ratio to an amorphous oxide semiconductor material (than a crystalline oxide semiconductor material), to remove the amorphous oxide semiconductor material, thereby forming a pattern of crystalline oxide semiconductor material active layer 3. That is, in this step, neither exposure nor development is required, and the pattern comprising the oxide semiconductor active layer 3 can be formed directly by an etching process.

Here, in the case where the oxide semiconductor material is indium gallium zinc oxide (IGZO), the etchant used in this step may comprise $H_2SO_4$, $HNO_3$, additive and so on. At this time, the etching ratio of amorphous IGZO to crystalline IGZO is between 50 and 200. Therefore, the oxide semiconductor material, i.e., the amorphous IGZO, is directly etched with the etchant, so as to form a pattern of crystalline IGZO oxide semiconductor active layer 3.

S14: Forming an etching stopping layer 4 on the substrate 10, on which step S13 has been performed, and forming a source electrode contact via hole and a drain electrode contact via hole respectively at positions of the etching stopping layer 4 corresponding to the source electrode contact region and the drain electrode contact region of the oxide semiconductor active layer 3.

In this step, an etching stopping material layer is firstly formed on the substrate 10, on which step S13 has been performed, by plasma enhanced chemical vapor deposition, low pressure chemical vapor deposition, atmospheric pressure chemical vapor deposition, electron cyclotron resonance chemical vapor deposition, or sputtering, and then a pattern comprising the etching stopping layer 4 is formed by exposing, developing and etching.

Here, a material for the etching stopping layer 4 may be silicon oxide, silicon nitride, hafnium oxide, silicon oxynitride, aluminum oxide, or the like. Alternatively, the etching stopping layer 4 may be a multilayer film composed of two or three of the aforementioned materials.

S15: Forming a pattern comprising a drain electrode 5 and a source electrode 6 of the oxide thin film transistor on the substrate 10, on which step S14 has been performed, by a patterning process.

In this step, a source/drain metal film is firstly formed on the substrate 10, on which step S14 has been performed, by plasma enhanced chemical vapor deposition, low pressure chemical vapor deposition, atmospheric pressure chemical vapor deposition, electron cyclotron resonance chemical vapor deposition, or sputtering, then a photoresist layer is formed on the source/drain metal film, and finally, a pattern comprising the source electrode 5 and the drain electrode 6 is formed by exposing, developing and etching.

Here, one or more of molybdenum (Mo), molybdenum-niobium alloy (MoNb), aluminum (Al), aluminum-neodymium alloy (AlNd), titanium (Ti), or copper (Cu) may be used as a material for the source/drain metal film. The source/drain metal film may be a monolayer or multilayer composite laminate formed from one or more of the aforementioned materials, for example, a monolayer or multilayer composite film composed of Mo, Al or an alloy containing Mo or Al.

Hereto, the preparation of the oxide thin film transistor is completed.

The embodiments of the present disclosure further provide another oxide thin film transistor and a preparation method thereof. The method for preparing another oxide thin film transistor is substantially the same as the above-mentioned method for preparing a thin film transistor, except for step S13. In this preparation method, in particular, step S13 may comprise the following steps.

Figure 5:
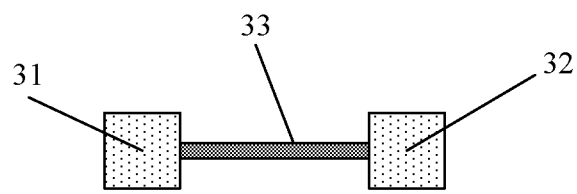
FIG. 5 is a schematic structural diagram of an oxide semiconductor active layer of an oxide thin film transistor according to an embodiment of the present disclosure.
Figure 6:
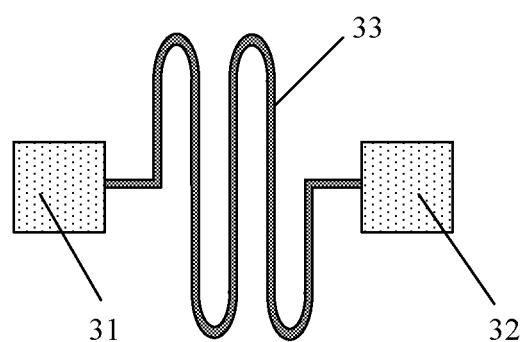
FIG. 6 is a schematic structural diagram of another oxide semiconductor active layer of an oxide thin film transistor according to an embodiment of the present disclosure.
Figure 7:
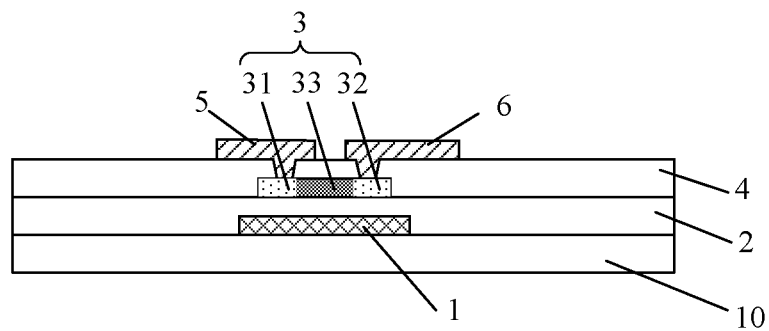
FIG. 7 is a schematic structural diagram of another oxide thin film transistor according to an embodiment of the present disclosure.

Specifically, as shown in FIGS. 5-7, the active layer 3 comprises a source electrode contact region 31, a drain electrode contact region 32, and a channel region 33 disposed between the source electrode contact region 31 and the drain electrode contact region 32. In this step, an amorphous oxide semiconductor thin film 30 is firstly formed on the substrate 10, on which step S12 has been performed, by magnetron sputtering, thermal evaporation, plasma enhanced chemical vapor deposition, low pressure chemical vapor deposition, atmospheric pressure chemical vapor deposition, or electron cyclotron resonance chemical vapor deposition, and a mask plate is placed on a side of the amorphous oxide semiconductor material away from the substrate 10 (the same as the above-mentioned step S131).

Next, the portion of the amorphous oxide semiconductor thin film, at a position corresponding to the channel region 33 of the oxide semiconductor active layer 3 to be formed, is subjected to a laser annealing by irradiating through the mask plate with a laser, in particular, with a KrF laser having a wavelength of 248 nm, to crystallize the amorphous oxide semiconductor material at the position in the amorphous oxide semiconductor thin film corresponding to the channel region of the oxide semiconductor active layer 3 to be formed, thereby forming a crystalline oxide semiconductor material 301 (the same as the above-mentioned step S132).

Subsequently, a photoresist layer is formed on the substrate 10 on which the above-mentioned step has been performed, and then the oxide semiconductor active layer 3 is formed by exposing, developing and etching. At this time, materials for the source electrode contact region 31 and the drain electrode contact region 32 of the formed oxide semiconductor active layer 3 are amorphous oxide semiconductor materials, while the material for the channel region 33 is a crystalline oxide semiconductor material. The advantage of such configuration lies in that the source electrode contact region 31 and the drain electrode contact region 32 can be prepared to be wider than the channel, as shown in FIG. 5 and FIG. 6, such that the source electrode and the drain electrode subsequently formed can be in good ohmic contact with the active layer 3.

It should be noted that the channel region of the active layer in FIG. 6 is formed in a bent and curved shape, and such configuration can effectively prevent the channel region of the active layer from breakage when the array substrate is twisted or bent, thereby preventing the failure of the thin film transistor.

As shown in FIG. 7, after forming the structure of oxide semiconductor active layer 3, a source electrode 5 and a drain electrode 6 of the thin film transistor are formed. As seen from FIG. 7, the source electrode 5 is connected to the source electrode contact region 31 of the active layer, and the drain electrode 6 is connected to the drain electrode contact region 32 of the active layer.

It should be noted that the preparation method comprising the above-mentioned steps is a method for preparing a bottom gate type thin film transistor. A method for preparing a top gate type thin film transistor is also provided in the embodiments of the present disclosure, and it differs from the above method for preparing a bottom gate type thin film transistor in that the step for forming an oxide semiconductor active layer 3 precedes the step for forming a gate electrode 1. Other steps are the same as the above-mentioned steps, and thus will not be described here.

The embodiments of the present disclosure further provide an array substrate comprising the above-mentioned oxide thin film transistor and a preparation method thereof comprising the above-mentioned preparation of the oxide thin film transistor.

In particular, the array substrate comprises a display area and a peripheral area provided with a driving circuit (GOA circuit), and the above-mentioned oxide thin film transistor may be used as a thin film transistor in the driving circuit (the above-mentioned method for preparing an oxide thin film transistor may be used in the preparation method thereof).

Figure 8:
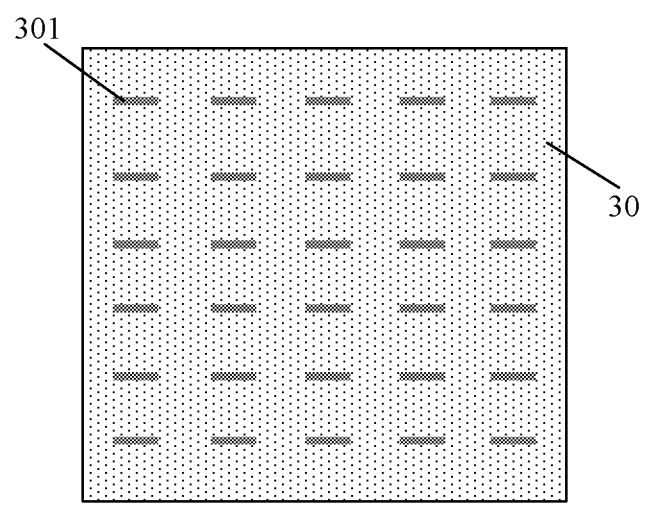
FIG. 8 is a schematic diagram of subjecting an amorphous oxide semiconductor thin film to a laser annealing in a method for preparing an array substrate according to an embodiment of the present disclosure.

For example, as shown in FIG. 8, for the active layer of the thin film transistor in each driving circuit at the peripheral area, a crystalline oxide semiconductor 301 may be formed by laser annealing a specific region of the amorphous oxide semiconductor thin film 30, in particular, with a KrF laser having a wavelength of 248 nm. As a result, the formed oxide semiconductor active layer 3 can be thinned so that the size of the thin film transistor is reduced, thereby contributing to achieving a narrow border design.

Of course, the method for preparing the array substrate may further comprise a step for forming a known structure such as a storage capacitor and a pixel electrode, which will not be listed here.

It can be understood that the above embodiments are only exemplary embodiments for illustrating the principle of the present application, but the present application is not limited thereto. For those skilled in the art, various variations and modifications can be made without departing from the spirit and essence of the present application, and these variations and modifications also fall within the protection scope of the application.

What is claimed is:

1. A method for preparing an oxide thin film transistor, comprising a step of forming a pattern comprising an oxide semiconductor active layer on a substrate, wherein the step of forming the pattern comprising the oxide semiconductor active layer comprises:

forming an amorphous oxide semiconductor thin film on the substrate;

performing an excimer laser annealing, at least at a position in the amorphous oxide semiconductor thin film corresponding to a channel region of oxide semiconductor active layer to be formed, such that the amorphous oxide semiconductor material at the laser-annealed position in the amorphous oxide semiconductor thin film is crystallized, to form a crystalline oxide semiconductor material; and forming the pattern comprising the oxide semiconductor active layer, wherein the laser has a wavelength in a range from 150 nm to 350 nm, wherein the formed oxide semiconductor active layer has a channel width less than 2 µm.

2. The method for preparing an oxide thin film transistor according to claim 1, wherein,
the step of forming the pattern comprising the oxide semiconductor active layer comprises:
forming the pattern comprising the oxide semiconductor active layer, only by an etching process.

3. The method for preparing an oxide thin film transistor according to claim 1, wherein the laser comprises a KrF laser with a wavelength of 248 nm.

4. The method for preparing an oxide thin film transistor according to claim 1, wherein a micro-lens array (MLA) device is used in the excimer laser annealing.

5. The method for preparing an oxide thin film transistor according to claim 1, wherein a material for the amorphous oxide semiconductor thin film is any one selected from an oxygen-containing compound, a sulfur-containing compound, a nitrogen and oxygen-containing compound, or a sulfur and oxygen-containing compound, each of the compounds comprising at least one element selected from indium, gallium, zinc, aluminum, or tin.

6. The method for preparing an oxide thin film transistor according to claim 1, wherein the formed oxide semiconductor active layer has a channel width of from $5\times10^{-3}$ µm to 10 µm.

7. The method for preparing an oxide thin film transistor according to claim 1, wherein, before the step of forming the pattern comprising the oxide semiconductor active layer, the method further comprises:
forming a pattern comprising a gate electrode of the oxide thin film transistor on the substrate by a patterning process, and forming a gate electrode insulating layer on a side of the gate electrode away from the substrate; and
after the step of forming the pattern comprising the oxide semiconductor active layer, the method further comprises:
forming a pattern comprising a source electrode and a drain electrode of the oxide thin film transistor by a patterning process, wherein the source electrode and the drain electrode are connected to a source electrode contact region and a drain electrode contact region of the oxide semiconductor active layer respectively.

8. The method for preparing an oxide thin film transistor according to claim 1, wherein, after the step of forming the pattern comprising the oxide semiconductor active layer, the method further comprises:
forming a pattern comprising a source electrode and a drain electrode of the oxide thin film transistor by a patterning process, wherein the source electrode and the drain electrode are connected to a source electrode contact region and a drain electrode contact region of the oxide semiconductor active layer respectively;
forming a gate electrode insulating layer on a side of the source electrode and the drain electrode away from the substrate; and
forming a pattern comprising a gate electrode of the oxide thin film transistor on a side of the gate electrode insulating layer away from the substrate by a patterning process.

9. A method for preparing an array substrate, comprising a step of forming a pattern comprising an oxide semiconductor active layer on a substrate, wherein the step of forming the pattern comprising the oxide semiconductor active layer comprises:
forming an amorphous oxide semiconductor thin film on the substrate;
performing an excimer laser annealing, at least at a position in the amorphous oxide semiconductor thin film corresponding to a channel region of oxide semiconductor active layer to be formed, such that the amorphous oxide semiconductor material at the laser-annealed position in the amorphous oxide semiconductor thin film is crystallized, to form a crystalline oxide semiconductor material; and
forming the pattern comprising the oxide semiconductor active layer.

10. An oxide thin film transistor comprising:
a gate electrode;
a source electrode;
a drain electrode; and
an oxide semiconductor active layer, comprising: a source electrode contact region and a drain electrode contact region connected to the source electrode and the drain electrode respectively, and a channel region between the source electrode contact region and the drain electrode contact region,
wherein at least the channel region of the active layer is formed from a crystalline oxide semiconductor material, said crystalline oxide semiconductor material being formed by performing a laser annealing using a laser having a wavelength in a range from 150 nm to 350 nm and the active layer has a channel width less than 2 µm.

11. The oxide thin film transistor according to claim 10, wherein the source electrode contact region and the drain electrode contact region of the active layer are formed from an amorphous oxide semiconductor material.

12. The oxide thin film transistor according to claim 10, wherein the channel region of the active layer has a bent and curved shape.

13. The oxide thin film transistor according to claim 11, wherein the amorphous oxide semiconductor material is any one selected from an oxygen-containing compound, a sulfur-containing compound, a nitrogen and oxygen-containing compound, or a sulfur and oxygen-containing compound, each of the compounds comprising at least one element selected from indium, gallium, zinc, aluminum, or tin.

14. The oxide thin film transistor according to claim 11, wherein the channel region of the active layer is formed by subjecting an amorphous oxide semiconductor thin film to a localized excimer laser annealing, wherein the amorphous oxide semiconductor material at the laser-annealed position in the amorphous oxide semiconductor thin film is crystallized to form the crystalline oxide semiconductor material.

15. The oxide thin film transistor according to claim 10, wherein the oxide thin film transistor is a bottom gate type thin film transistor.

16. The oxide thin film transistor according to claim 10, wherein the oxide thin film transistor is a top gate type thin film transistor.

17. An array substrate comprising the oxide thin film transistor according to claim 10.

18. The array substrate according to claim 17, wherein the array substrate comprises a display area and a peripheral area provided with a driving circuit, wherein the oxide thin film transistor is used as a thin film transistor in the driving circuit.

* * * * *